United States Patent [19]

Farnsworth

[11] 4,264,897
[45] Apr. 28, 1981

[54] METER REGISTER ENCODER INCLUDING ELECTRONICS PROVIDING REMOTE READING CAPABILITY

[75] Inventor: Richard G. Farnsworth, York, Me.

[73] Assignee: General Electric Company, Somersworth, N.H.

[21] Appl. No.: 48,236

[22] Filed: Jun. 13, 1979

[51] Int. Cl.³ ............. G08C 19/16; H04Q 9/00; H04M 11/00
[52] U.S. Cl. ............. 340/870.29; 179/2 AM; 250/231 SE
[58] Field of Search ........... 340/310 R, 310 A, 190, 340/347 P; 250/231 SE; 179/2 AM

[56] References Cited

U.S. PATENT DOCUMENTS

| | | | |
|---|---|---|---|
| 3,842,268 | 10/1974 | Cornell | 340/190 |
| 3,846,789 | 11/1974 | Germer et al. | 340/190 |
| 3,875,406 | 4/1975 | Holeman | 340/190 |
| 4,022,977 | 5/1977 | Nomura | 179/2 AM |
| 4,104,486 | 8/1978 | Martin et al. | 179/2 AM |
| 4,135,181 | 1/1979 | Bogacki et al. | 340/310 A |

Primary Examiner—Thomas A. Robinson
Attorney, Agent, or Firm—Robert E. Brunson

[57] ABSTRACT

A self-contained meter register optical encoder including electronic signal generation, surge protection and power supply circuitry is remotely readable to supply timing and data signals to an external device when energized from an external power source.

8 Claims, 11 Drawing Figures

METER REGISTER ENCODER INCLUDING ELECTRONICS PROVIDING REMOTE READING CAPABILITY

BACKGROUND OF THE INVENTION

1. Field of the Invention

The present invention relates generally to a remotely readable meter register encoder and more particularly to electronic circuitry used in combination with the encoder to provide a self-contained, and universally adaptable meter register and encoder assembly for use in remote meter reading system applications.

2. Description of the Prior Art

The present invention finds particular application in the utility industry, where meters and their attendant encoders are automatically read over a communication line to collect utility consumption data for billing a consumer according to the amount of his electrical energy, water, and gas consumption.

There are various types of encoders frequently in use in automatic meter reading systems. These encoders range from parallel read-out devices to pulse indicator type devices, which provide switch closer output signals representative of consumer data. Another type of encoder is of the serial read-out type. It is this type in which the present invention finds an advantageous use. An encoder of this latter type, and various features thereof, is disclosed in U.S. Pat. Nos. 3,846,789 and 3,875,406. Also, the circuitry of the present invention, and an encoder utilizing that circuitry, is diclosed in U.S. Pat. application Ser. No. 48,537 filed on even date herewith entitled "Optical Encoder and Timing Generator System for Automatic Meter Reader", to Donald M. Ham and assigned to the assignee of the present invention. Further, a representative system of the type suitable for implementation of the present invention is disclosed in U.S. Pat. No. 4,135,181 entitled "Automatic Remote Meter Reading and Control System", also assigned to the assignee of the present invention. In this system, the encoder communicates with an external device called a meter terminal unit.

A completely self-contained remotely readable meter register and encoder assembly provides, inter alia, the advantages of, (1) lower cost, because it allows standardization and can be easily manufactured in large quantities, (2) readily adaptable to implementation (eg. plug-in capability) and (3) built in reliability by the use of well proven circuitry which does not have to be redesigned each time the encoder is used in a different application or environment. Also by incorporating all of the encoder power supply, readout and timing circuitry within the meter and encoder, additional economics and installation flexibility in the design can be achieved. With this design flexibility, sufficient signal drive can be achieved, which allows the encoder to be mounted either close to or far away from the external device (such as a meter unit) with which the encoder communicates. The ability to mount the encoder a considerable distance from the external device can be of significant value when installation constraints preclude the adjacent installation of the encoder and the external device.

In view of the preceding, it is therefore desirable to provide a completely self contained meter register encoder apparatus which contains its own power supply and signal read-out electronics and which is universally suitable for a variety of metering applications.

SUMMARY OF THE INVENTION

The present invention resides in a novel combination of elements in a remotely readable meter register encoder and its attendant electronics to provide a fully self-contained readout device capable of providing timing and meter data signals for use by an external device.

Energizing current from the external device, or some other power source, energizes the encoder and electronic circuitry to enable the generation of the timing and data signals for output to the external device.

A motor driven optics illuminator assembly, including an apertured scanning and timing disc provide timing and data light pulses to photo-sensors. A circuit board, mounted in the meter register encoder assembly, includes micro-miniaturized timing and data pulse generator circuitry for providing the timing and data pulses at an output connector in response to signals from the photo-sensors.

The circuit board also serves as an over voltage or surge protector for the motor and a light source in the optics illuminator, and further provides regulated DC bias voltage for the pulse generator circuitry and the photo-sensors. Pull up resistors on the circuit board also serve to control the conduction of the photo-sensors.

Accordingly, it is a primary object of the present invention to provide an improved self-contained remotely readable encoder assembly having enhanced operating characteristics.

It is a further object of the present invention to provide a circuit board in an optical encoder having voltage protection with power supply and regulation in conjunction with signal generation circuitry for providing timing and data signals to an external device.

Another object of the invention is to provide circuit and power supply means in a meter register encoder for providing output timing and data signals only when energized from an external source.

Yet, a still further object of the present invention is to provide a circuit board having integrated circuits thereon operating in combination with a photo-sensor and optics encoder for providing synchronized serialized timing and data pulses to an output connector.

It is another object of the invention to provide a self-contained, plug connectable meter register encoder and electronic circuitry for universal application with external devices used in automatic meter reading systems and the like.

BRIEF DESCRIPTION OF THE DRAWING

A more complete understanding of the present invention can be obtained by considering the following detailed description in conjunction with the accompanying drawing in which.

DESCRIPTION OF THE PREFERRED EMBODIMENT

Although the improved optical encoding and timing system for an automatic meter reader constructed in accordance with the invention is usuable with a variety of data generating or measuring apparatus, including various types of electricity meters, gas meters, water meters and the like, the preferred embodiment is explained with regard to a watthour meter for residential service. The register section of the watthour meter is provided with an optical meter reader encoder and timing generator apparatus for remote readout capability. The register section also includes a conventional decade gearing arrangement that rotates a series of indicator dials, one for each digit of power consumption, for visually reading the meter. In the present invention, this decade gearing also forms a part of the reader encoder. Also, the mechanism within the meter which actually measures the electrical quantity of power consumption and which drives the decade gearing can take on various forms as is known in the meter art.

Figure 1:
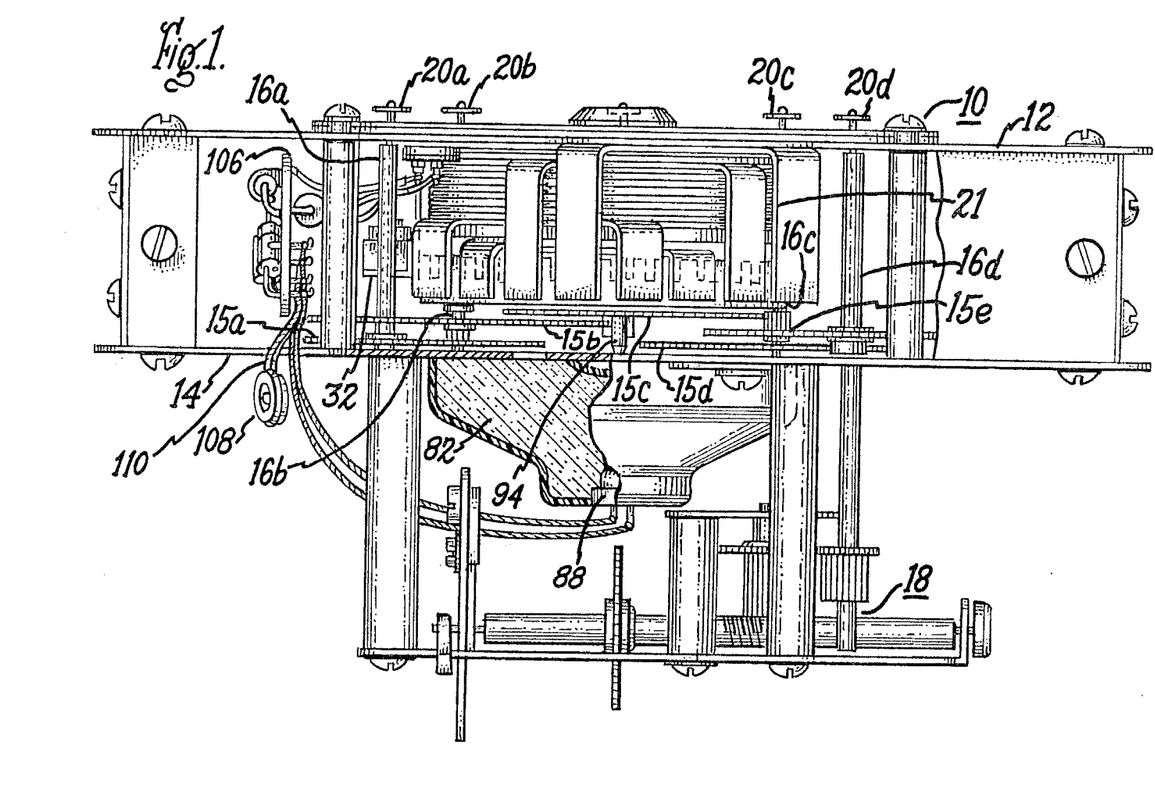
FIG. 1 is a bottom view, partially in cross section, of the main components of a remote meter reading register with an optical encoder with data and timing readout and illustrating a unitized hollow core hysteresis motor surrounding an optics illuminator and encoder scanning disc assembly in accordance with the invention.

Referring initially in FIG. 1, there is shown a remote reading register 10 of a kilowatt-hour meter at approximately four times actual size. The register 10 has a front plate 12 and a parallel back plate 14 for the mounting therebetween of other register components. A plurality of decade indicator drive gears and slotted encoder discs 15a-15e are secured to corresponding indicator shafts 16a-16d, with the shaft of gear 15c not shown. Each of the shafts is disposed between the front and back plates in suitable bearings for rotation when driven through a conventional meter drive shown generally as 18. Each one of a set of manually readable dials or indicators 20a-20d is attached to a corresponding indicator shaft on the face of the front plate, with the center dial not shown. In the present embodiment, due to the ratio of the gears 15a-15c, the rotational positions of the shafts, and the slotted encoder gears, and the manually readable dials, correspond to the respective digit positions of a five-digit kilowatt-hour meter read-out.

Also mounted between the plates 12 and 14 is a remotely readable optical encoder means 21 secured to the front plate by screws not shown. The structural details and operating characteristics of the optics and motor portion of the encoder is best understood by reference to the severals views of that portion shown in FIGS. 2-5. As illustrated, the encoder 21 is comprised of a hollow core hysteresis motor 22, including an apertured rim shaped scanning disc 24 (see FIG. 5). A parabolic shaped reflector or optics illuminator 26, including a light source 28 in a slotted light mounting hub 30, is configured to fit within the hollow core of the motor. A timing pulse generator photo sensor or light detector means 32 is suitably mounted on a tab or mounting means 34 on the motor with a screw 36. The sensor is actually encased in a holder 38.

Figures 5, 6:
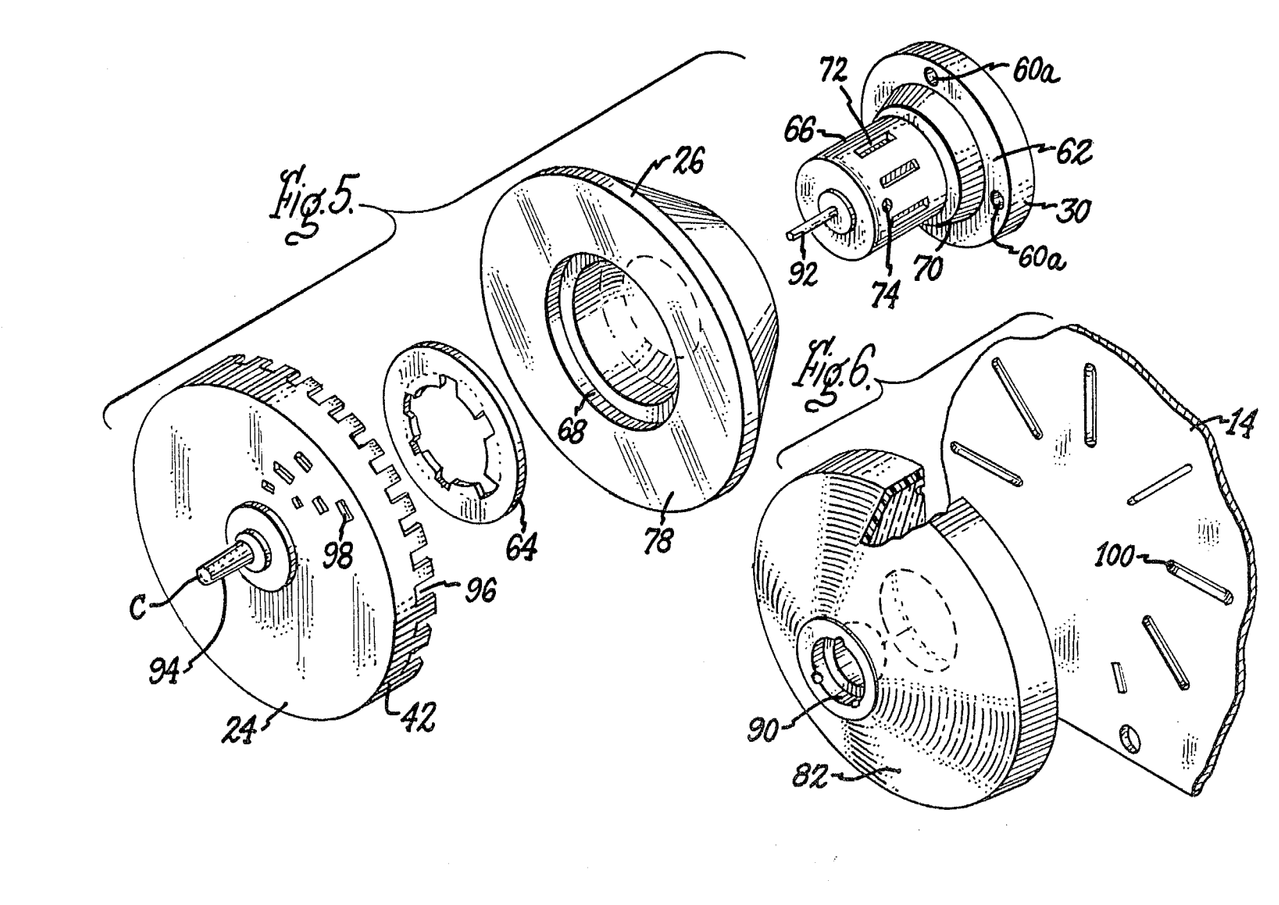
FIG. 5 is a diagrammatic exploded perspective view of the optics illuminator showing its attendant light souce mounting hub and the scanning disc.
FIG. 6 is an diagrammatic exploded perspective view of an optics collector for holding a data photo sensor and illustrating the collector's relationship to a slotted back plate of the meter of FIG. 1 to allow collimated light from the scanning disc to impinge on the data photo sensor.

The scanning disc 24 serves as the rotor of the motor 22, and to this end the disc 24 contains a ferro-magnetic material 40 having a high hysteresis loss, to enable the production of torque, nested around the inner periphery of the rim portion 42 of the scanning disc. The motor, being of a hollow design, and of an unsymmetrical or tapered shape, suitably conforms to the shape of the illuminator 26 and is surroundingly mounted on the exterior frusto-conical side of the parabolic shaped illuminator.

The motor is of the shaded pole stator type to produce an approximately constant rotating magnetic field, which enables the motor to start and run efficiently. In a preferred form, a stator 44 of the motor is comprised of several different components that are stacked or nested one upon the other as shown in the cross-sectional view of FIG. 2. Also, see FIGS. 1 and 4 for an overall perspective view of the shapes of those components.

Figures 2, 3, 4:
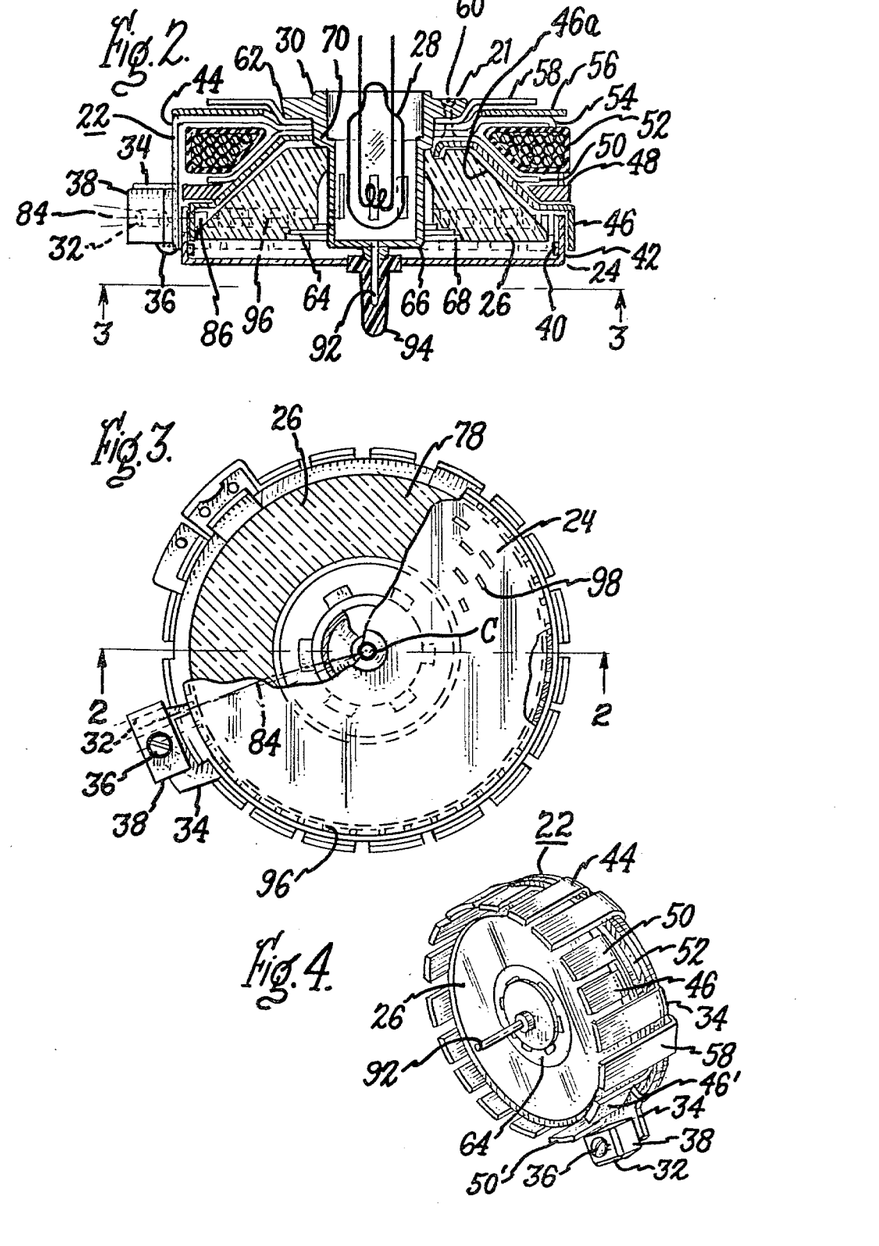
FIG. 2 is a bottom view, taken in cross section along lines 2—2 of FIG. 3, illustrating the inner relationships between the optics illuminator, the hysteresis motor and a timing photo sensor for generating clock timing pulses from light collimated through slots in the apertured scanning disc.
FIG. 3 is an end view, partially in cross section, of the optics illuminator, hysteresis motor and timing photo sensor taken along lines 3—3 of FIG. 2.
FIG. 4 is a perspective view of the assembled hollow core hysteresis motor, optics illuminator and timing pulse generator photo sensor minus the scanning disc.

In order, the preceding stator components are identified as; (1) a first shaded pole stator lamination and hollow core member 46; (2) a first shading ring 48; (3) a first unshaded pole stator lamination 50; (4) a stator winding 52; (5) a second unshaded pole stator lamination 54; (6) a second shading ring 56; and (7) a second shaded pole stator lamination 58.

In the preceding stator structure, while either stator lamination and shading ring assembly can provide the north stator poles and the other the south stator poles, for convenience the stator members 46-50 are referred to as the north stator pole elements and the stator members 54-58 as the south stator pole elements. The shaded pole stator lamination 46 is conically shaped to conform to the outer frusto-conical portion of the parabolic illuminator 26 as shown at 46a of FIG. 2. Also, the stator components 46-58 are all secured together to the hub or stator mount 30 by several rivets 60 (only one being shown) passed through holes 60a (FIG. 5) in a shoulder 62 and each of the components 48-58. Further, as shown in FIGS. 2 and 5, the illuminator 26 has a cylindrical hole through its center axis allowing it to slide onto a barrel 66 of the hub 30. As shown, a compression fit retaining ring 64 is then compressed over the barrel 66 into a recess 68 of the illuminator to tightly hold the illuminator in place around the barrel by compressing the small end of the illuminator against a retaining shoulder 70 on the hub 30.

As best seen in FIGS. 2 and 5, the barrel 66 of the light mounting hub 30 contains a plurality of circumferentially displaced slots 72 and an aperture 74. When the motor is operating to enable reading the encoder, the light source 28 is turned on and light is transmitted through the slots 72 and aperture 74 to the illuminator 26, where that light is collimated into light patterns as shown in FIGS. 2, 3 and 7.

To understand how the collimated light through aperture 74 is detected by the timing sensor 32, it should be recognized that the frusto-conical exterior portion of the illuminator is suitably coated with a silver or aluminum reflective coating for reflecting the light. As shown in FIG. 7, the collimated light is reflected basically along two paths from the illuminator. One of these paths is shown by dashed lines 76 whereby the light exits the frontal portion 78 of the illuminator along its horizontal axis and impinges on the frontal portion 80 of a collecting optics or collector member 82 having a reflective coating similar to the illuminator.

Figure 7:
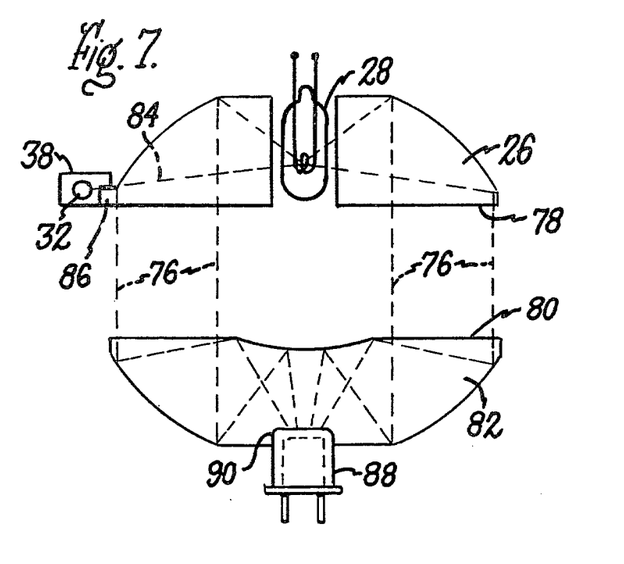
FIG. 7 is a sectional view of an optical reading illumination and sensing assembly of the encoding and timing mechanism of FIG. 1 illustrating the optics illuminator and optics collector showing the collimated light patterns and phto sensors.

As shown in FIG. 1, the collector optics 82 is suitably mounted on the back plate 14 in facing alignment with the illuminator 26 (see FIG. 7). A data photo sensor 88 is mounted within a recess 90 (FIG. 6) in the collector and serves to collect collimated light from the illuminator as transmitted along the light path 76.

The other light path travels substantially radially or perpendicular to the center axis of the illuminator as shown by dashed lines 84. As best shown in FIGS. 2 and 7, a transparent tab or appendage 86 is formed or otherwise attached on the outer circumference of the illuminator. The tab 86 serves as a collimator to allow the light along path 84 to impinge on the timing photo sensor 32. Preferably, the outer portion of the tab 86 is also coated with a reflective substance except for a small portion on the end facing the sensor 32. This uncoated portion allows the light along path 84 to therefore pass in a precisely controlled light beam from the illuminator through the tab where it is picked up by the sensor 32.

Further detailed information on a remote reading optical encoder means with its associated optical system and motor construction of a type similar to that disclosed herein can be obtained from the previously mentioned U.S. Pat. Nos. 3,842,268; 3,846,789; and 8,875,406.

Reference is now made to FIGS. 2, 3, and 5 for illustrations showing how the scanning disc 24 is mounted on the unitized motor and optics assembly. A shaft or axle member 92 is attached to the scanning disc end of the mounting hub 30, such as by bonding, machining or casting. The axle 92 projects rearwardly of the register toward the backplate 14 and supports a rotatable bearing member or drum 94 which is rigidly attached to the scanning disc 24. As shown in FIGS. 1 and 3, the scanning disc is rotatable about the shaft 92 at a center point C. The tip of the drum 94, with the motor and optics assembly mounted between the front and rear plates as shown in FIG. 1, operates in very close proximity to the back plate 14. Under normal rotation of the scanning disc 24, the tip of the drum does not touch the backplate. However, should the scanning disc attempt to axially ride off of the shaft 92, its travel is inhibited by the tip of the drum 94 lightly contacting the backplate 14.

As best shown in FIG. 2, the scanning disc is circular whereby its rim portion 42 is formed to rotate inside the stator members under the influence of currents induced in the rotor scanning disc as previously described. Further, as shown in FIGS. 2, 3 and 5, the scanning disc has a plurality of timing slots or apertures 96 formed in the rim portion 42 for allowing the light along path 84 to be detected as light pulses by the light sensor 32 with rotation of the scanning disc. It is this feature of the timing slots in combination with the timing sensor 32, the aperture 74 in the light mounting hub 30 and the collimating light illuminator which makes it possible for the present invention to provide timing pulses in absolute time synchronism with the data pulses generated by the encoder data sensor 88.

The face of the scanning disc 24 also contains a series of relatively small, rotationally staggered apertures 98 at different radial distances from the center C (FIGS. 3 and 5). These scan or data apertures can be said to be in a spiral pattern and serve to facilitate in the readout of data as binary information corresponding to the rotational positions of the encoding discs 15a–15c.

Figure 8:
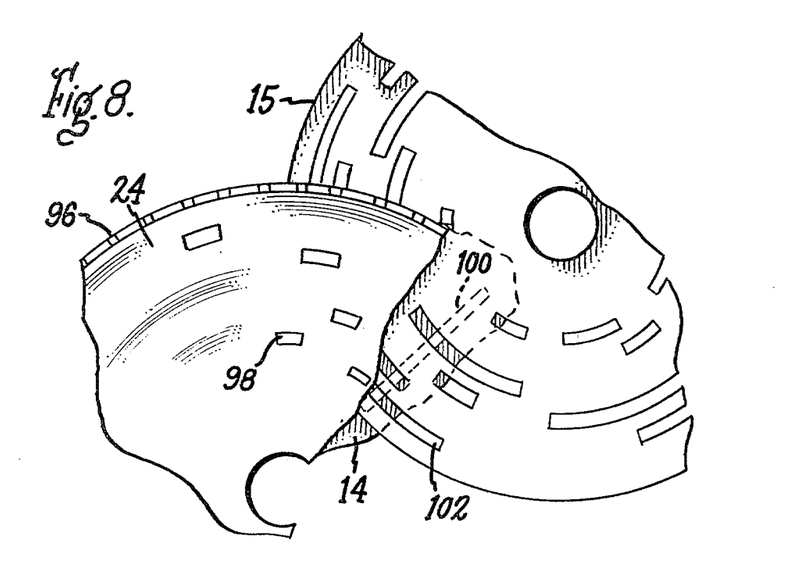
FIG. 8 shows fragments of an encoding disc of FIG. 1, together with associated means for reading the meter indicator shaft positional information from the encoder disc by alignment of its reading slots with the scanning disc apertures and a slot in the backplate FIG. 6.

As illustrated in FIGS. 6 and 8, the backplate 14 contains a plurality or set of spoke-like slots or openings 100 spaced a substantially equal angular distance from one another, so that only one of the encoding discs is read at a time. As shown in FIGS. 7 and 8, to enable the passage of light along path 76 to data photosensor 88, indicating either a binary "one" or "zero", coincidence is required between an aperture 102 in an encoding disc, a scan aperture 98 in the scanning disc, and the corresponding reading slot 100 in the backplate 14. The five encoding discs 15a–15e are scanned sequentialy during one revolution of the scanning disc, while one or more clock or timing pulses are generated by sensor 32 for each data bit (binary 1 or 0) generated by the data sensor 88. For additional detailed information on how the parts of the scanning disc, the encoder discs and the backplate are structured with respect to each other reference is made to the aforementioned U.S. Pat. No. 3,842,268 incorporated herein specifically by reference.

Referring to FIGS. 2-4, it can be seen that the timing sensor 32 is positioned on the sensor mount or tab 34 of the pole stator or member 48 to receive collimated light pulses aong path 84 passing between two adjacent stator members such as 46' and 50'.

Figure 9:
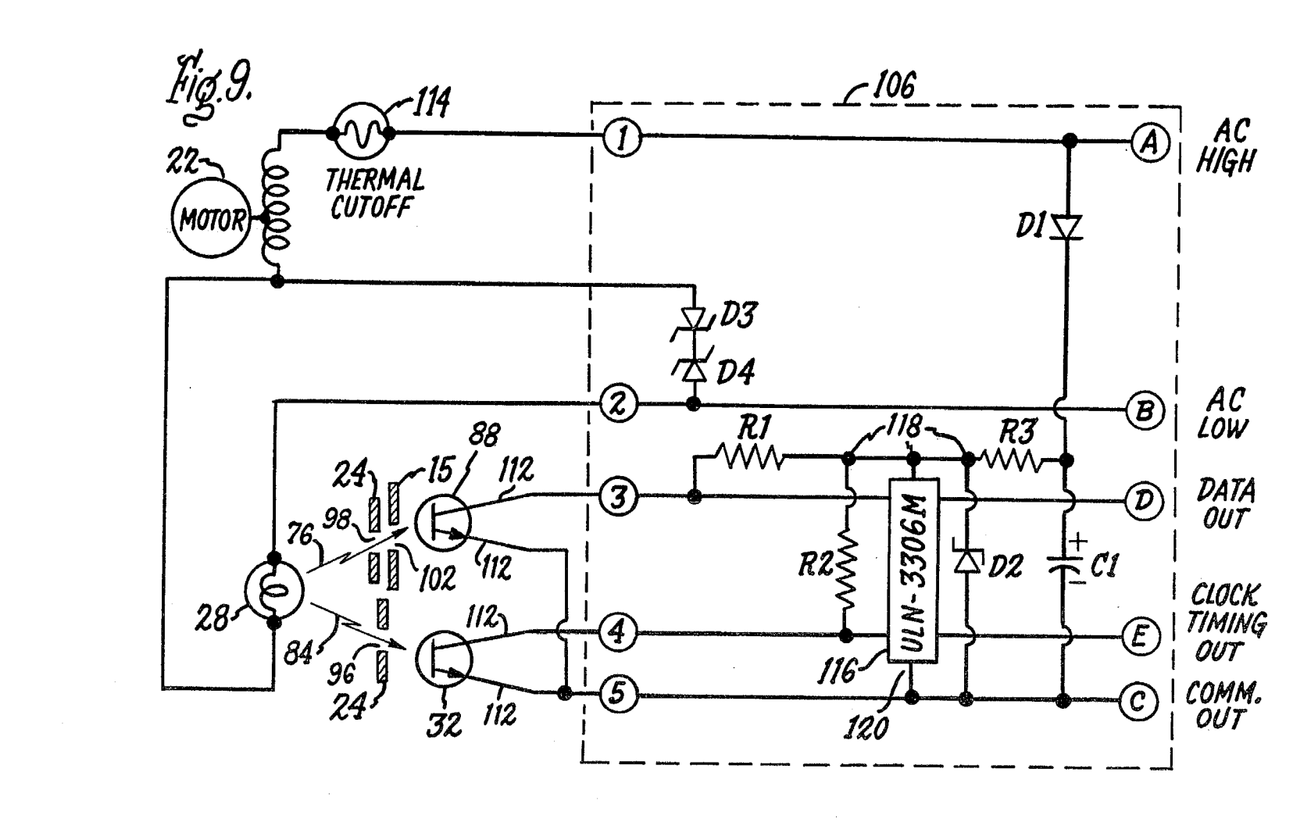
FIG. 9 is an electrical schematic diagram of an optical reading circuit for providing the data and timing pulses detected by the photo sensors.

In FIG. 1 there is illustrated a circuit board 106 which contains micro-miniaturized circuits and components as shown in the electrical schematic of FIG. 9. While the circuit 106 is shown as being physically mounted between the front and rear plates 12 and 14, it is to be understood that its physical location, shape and size within the encoder meter register assembly may take on various forms and be mounted in any location suitable to the type and configuration of the assembly in which it is used.

The disadvantage of providing a circuit such as that shown in FIGS. 1 and 9 within the meter assembly is to provide a complete unitized structure which can be manufactured as a standard encoder product suitable for tie-in to various external devices without the addition of special timing and data pulse generator logic.

A plug or connecting means 108 is utilized for making an external connection to the encoder circuitry 106 (FIG. 1). This connection to the circuit board is provided via a plurality of conductors 110 which are connected to terminals A–E as shown in FIG. 9. The timing and data photo sensors 32 and 88 are also connected to the circuit board at terminals 3-5 via conductors 112. In a similar fashion, terminals 1 and 2 provide connecting points to the circuit board for the motor 22 and lamp 28.

AC power is provided to the motor and the lamp at terminals A and B of the circuit board from an external device or power source not shown. Terminal A is shown as receiving the AC high line and terminal B is connected to the AC low or neutral line of the external power source. When AC power is applied to terminals A and B of the circuit, the motor 22 is energized by AC current flowing through an optional thermal cutoff or fuse 114, the motor field and the lamp 28. This AC current also turns on the lamp 28 to allow the sensing of light pulses by the sensors 32 and 88 as the scanning and timing disc 24 is rotated by the motor.

A pair of zener diodes D3 and D4 are connected back to back across the lamp 28 and serve to regulate the voltage applied thereto to prevent the lamp from being damaged should the AC voltage exceed the lamp limits. By connecting diodes D3 and D4 in the manner shown in FIG. 9, the lamp is protected during both the positive and negative half cycles of the AC current.

As illustrated in FIG. 9, the sensors 32 and 88 are connected as open-base transistors having their emitters connected in common to terminal 5 of the circuit 106. The collector of sensor 32 is connected to terminal 4 and the collector of sensor 88 is connected to terminal 3 of the circuit.

With the motor and the lamp energized, the collimated light along light paths 76 and 84 is allowed to impinge on the bases of sensors 32 and 88 as light and dark pulses representative of data and timing information. These light pulses cause the sensors to turn on and off to apply pulses to a dual Schmitt trigger integrated circuit 116 shown as a commercially available type ULN-3306M.

The data and clock timing circuit of FIG. 9 also includes its own regulated DC power supply for providing bias voltage for the trigger circuitry 116 and the sensors 32 and 88. This power supply is comprised of a rectified diode D1 connected in series with a filter-capacitor C1. This series connection is between the A and C terminals, with terminal C providing a common or ground return to an external device for reading the data and timing information provided by the encoder circuitry 106. The common output terminal C should preferably be at or near the same potential as the AC low terminal B. While this is not a requirement for the power supply to function, terminals B and C are preferably externally connected together to provide that same potential. DC voltage regulation for the power supply is provided by a voltage regulator zener diode D2 connected in series with a resistor R3, with the series combination of D2 and R3 being connected in parallel with C1.

Two resistors R1 and R2 are connected in common at one end to the high end of the power supply at a junction 118. The other end of each of the resistors R1 and R2 is connected to the collector of a corresponding sensor, with those resistors serving as pull-up resistors for the collectors of sensors 32 and 88. DC bias is provided to the trigger circuit 116 by connecting the power supply common (terminal C) to the circuit at a point 120 and connecting the voltage terminal of the power supply at junction 118.

In FIG. 9, the scanning disc 24 and a one of the encoder discs 15 is schematically illustrated as being disposed between the light source 28 and the sensors 32 and 88. For explanation purposes, only one of the six data apertures 98 of the scanning disc is shown along with one of the timing slots or apertures 96. Also, only one of the encoder disc apertures 102 of one disc 15 is shown. FIG. 9 does not illustrate the presence of the slotted back plate 14 positioned between the scanning disc 15 and the data sensor 88.

To understand how the invention generates the clock timing pulses in absolute time synchronism with the data pulses or bits, reference is first made back to FIG. 5. As previously described, there are six apertures 98 in the face of the scanning disc 24 for allowing the collimated light pulses along the light path 76 to be sensed by the data sensor 88 when the disc is rotated. In the preferred embodiment there are forty-eight evenly spaced timing slots or apertures 96 in the skirt or rim portion 42 of the scaning disc. These slots 96 are in phase relationship with the six data apertures 98 so that a timing pulse will be generated for each data bit read by the encoder.

Figure 10:
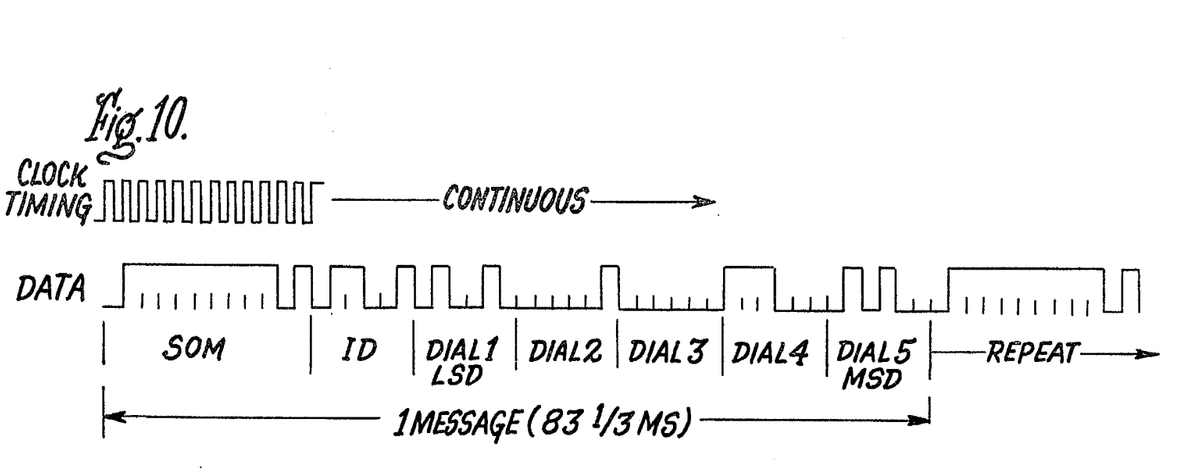
FIGS. 10 and 11 are timing diagrams showing the time coincidence relationships of the encoder data and clock timing signals generated by the apparatus of FIG. 1 and the circuit FIG. 9.

To understand the above mentioned phase relationship reference is now made to FIG. 10 which illustrates the clock timing output signal from terminal E and one complete message from the data out terminal D of FIG. 9. This phase relationship is established by providing one timing slot on the scanning disc for each bit to be read and generated by the encoder. In the present embodiment, the data message of FIG. 10 is assumed to be forty eight bits in length, with a start of message (SOM) field containing twelve bits, an identification code (ID) field containing six bits and five dial fields (DIAL 1-DIAL 5) having six bits each.

In the operation of the encoder and circuit of FIG. 9, when the encoder is energized, the scanning disc effects the continuous generation of the timing pulses along with the generation of the data or message pulses. This continuous generation or read-out of the encoder will continue as long as AC power is applied to the encoder circuit of FIG. 9, with the forty eight bit message being continuously repeated.

Figure 11:
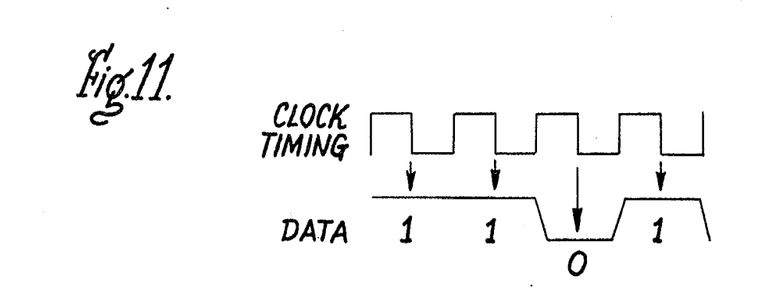

FIG. 11 is an enlarged drawing of the timing diagram of FIG. 10 and more clearly shows the timing relationship between the timing pulses and the data pulses. The data pulses are generated as binary 1 and 0 bits, with a binary 1 bit being represented a positive or high signal and a binary 0 being a negative or low signal. This timing relationship can further be understood by reference to FIG. 8. There it can be seen that there are eight (8) timing slots 96 for each of the data apertures 98 in the scanning disc 24. As the scanning disc is rotated, its six staggered apertures 98 sequentially scan the six slots 102 in each of the discs 15 while a timing pulse is generated for each slot 102 or aperture 98. If a slot 102 lines up with an associated aperture 98, a light pulse will pass through the slot 102 and the back plate slot 100 where the light pulse is detected by the data sensor 88.

Referring now back to FIG. 9, it can be seen that each of the sensors 32 and 88 are of the NPN type and will conduct when light strikes their base. Thus, it can be seen that the absence of light will turn off a sensor causing its collector to go high to a binary 1, substantially the voltage at point 118. When light strikes the base of a sensor (such as through aperture 96 to sensor 32), that sensor will conduct causing its collector to go low to a binary 0, substantially the potential of the common out or ground terminal C.

As previously mentioned, the ULN-3306M integrated circuit is a dual Schmitt trigger circuit. However, other types of circuits may be used. The output of the data sensor 88 at terminal 3 will trigger one of these Schmitt trigger circuits each time the sensor 88 conducts, to thus generate a binary 0 pulse at the data out terminal D of FIG. 9. In a similar fashion, the other Schmitt trigger circuit is triggered by the timing sensor 32 to provide a continuous output clock timing pulse at terminal E. (48 timing pulses/message).

In the preceding discussion of the message length and clock timing, a forty eight bit message is assumed. However, it will be understood by those skilled in the art that any length of message may be used. Whatever that message length is will determine the number of timing slots required in the rim of the scanning disc in order to achieve the aforementioned proper phase relationship between the data and clock timing pulses.

In the embodiment illustrated, the clock and data bit rate equals 576 bits per second. As previously described, the length of a complete encoder message is 48 bits, with each bit time equal to 1/576 which is equal to 1.736 ms. Thus the message time is 1.736×48 which equals 83⅓ ms as shown in FIG. 10.

In summary of the preceding, the improved optical encoder apparatus of the invention is seen to have use in remotely readable metering or measuring devices of the type having positionally rotatable slotted encoding discs which, when light scanned by an apertured disc, allow the development of data pulses representative of metered or measured values as specified by the rotational positions of the encoding discs.

The apertured scanning and timing disc further contains timing slots which allow collimated light from an optics illuminator to be sensed by a timing sensor to generate timing pulses in time synchronism with the data pulses. A circuit containing trigger circuits and providing voltage regulation and power supply capability provides the data and timing pulses as output signals from the encoder apparatus for use by an external device. The advantages of presenting the synchronized timing and data pulses to the external device make it possible to more easily and economically design a circuit to detect the start of the serialized message and to capture the entire message content without error. This is made possible by the usage of the timing pulses which are derived from the same source as the data pulses, to control the clocking of each of the data bits in a message into a suitable storage or receiving apparatus in the external device receiving the message.

While only one detailed exemplary embodiment of the invention has been described, those skilled in the art will recognize that it will be possible to modify many features of this exemplary embodiment without departing from the improved teachings and features of this invention. Accordingly, all such modifications are intended to be incorporated within the scope of this invention as defined in the appended claims.

What is claimed is:

1. In a remotely readable meter register encoder of the type including a motor and a unitized optics illuminator having a light source for providing light signals through apertured scanning and encoder discs to first and second photo-sensors to effect the generation of synchronized first and second signals representative of timing and data information respectively for use by an external device, the combination comprising:
(a) connecting means connecting the encoder to said external device for providing timing and data signals thereto and for receiving excitation current from said external device; and
(b) a circuit board mounted on the meter register encoder, said circuit board including,
(1) timing and data signal generation circuits connected to said first and second photo-sensors respectively and to said connecting means, said timing and signal generation circuits responsive to the first and second signals respectively from said first and second photo-sensors to provide synchronized timing and data signals to said external device via said connecting means, and
(2) means connected to said connecting means, including means for providing excitation current to said timing and data signal generation circuits and to said light source and motor from said external device to effect the reading of the timing and data signals from said timing and data signal generation circuits.

2. The remotely readable meter register encoder in accordance with claim 1, wherein said means for providing excitation current to said light source includes surge voltage protection means for controlling the magnitude of excitation current and voltage applied to said light source.

3. The remotely readable meter register encoder in accordance with claim 1, wherein said means for providing excitation current to said timing and data signal generation circuits includes a regulated power supply for providing bias voltage for said timing and data signal generation circuits.

4. The remotely readable meter register encoder in accordance with claim 3, wherein said regulated power supply further provides bias voltage for said first and second photo-sensors.

5. The remotely readable meter register encoder in accordance with claim 4, wherein said circuit board further includes first and second pull-up resistors connected between an output terminal of each of said first and second photo-sensors respectively and the bias voltage of said regulated power supply for controlling theconduction of said first and second photo sensors.

6. A self-contained remotely readable meter register encoder for providing timing and data signalsto an external device when provided excitation current from an external source comprising:
(a) an optics illuminator, including an energizable light source and motor for driving an apertured timing and scanning disc which is in light communication with said optics illuminator to provide synchronized first and second light pulses representative of timing and encoder data to first and second photo-sensors respectively to effect the generation of first and second output signals therefrom;
(b) connecting means for providing timing and data signals from the encoder to said external device and for receiving excitation current from said external source; and
(c) electronic circuitry contained within the meter register encoder including,
(1) first and second pulse generator circuits connected to said first and second photo-sensors respectively and to said connecting means, said first and second pulse generator circuits responsive to the first and second output signals from said first and second photo-sensors to provide synchronized timing and data signals respectively to said external device via said connecting means; and (2) means connected to said connecting means for providing excitation current from said external source to said electronic circuitry and to said light source and said motor to effect the reading of said timing and data signals from the encoder, said means for providing excitation current including voltage protection and regulator means for controlling the magnitude of excitation current and voltage applied to said light source, a regulated power supply for providing bias voltage for said first and second pulse generator circuits and said first and second photo-sensors and means for protecting said motor from over voltage and current.

7. The self-contained remotely readable meter register encoder in accordance with claim 6, wherein said means for protecting said motor from over voltage and current is a thermal cutoff device.

8. The self-contained remotely readable meter register encoder in accordance with claim 6, wherein said electronic circuitry is mounted on a circuit board in the encoder and wherein said first and second pulse generator circuits are of the integrated circuit Schmitt trigger type.

* * * * *